(12) United States Patent
Nagaoka

(10) Patent No.: US 7,923,762 B2
(45) Date of Patent: Apr. 12, 2011

(54) SEMICONDUCTOR DEVICE AND METHOD OF MANUFACTURING THE SAME

(75) Inventor: Kojiro Nagaoka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/364,343

(22) Filed: Feb. 2, 2009

(65) Prior Publication Data
US 2009/0224338 A1 Sep. 10, 2009

(30) Foreign Application Priority Data
Mar. 7, 2008 (JP) ................ P2008-057744

(51) Int. Cl.
*H01L 29/76* (2006.01)
(52) U.S. Cl. .. 257/288; 257/327; 257/410; 257/E29.255
(58) Field of Classification Search .................. 257/288, 257/327, 410, E29.255
See application file for complete search history.

(56) References Cited

U.S. PATENT DOCUMENTS
6,515,338 B1 * 2/2003 Inumiya et al. ............... 257/368
6,908,801 B2 * 6/2005 Saito ............................. 438/199

OTHER PUBLICATIONS

Yagishita et al., High Performance Metal Gate MOSFETs Fabricated by CMP for 0.1 micron Regime, International Electron Devices Meeting 1998, Technical Digest pp. 785-788 (1988).

* cited by examiner

*Primary Examiner* — Tan N Tran
(74) *Attorney, Agent, or Firm* — Robert J. Depke; Rockey, Depke & Lyons, LLC

(57) ABSTRACT

Disclosed herein is a semiconductor device, including: an insulating film provided on a semiconductor substrate so as to have a trench pattern; a gate insulating film provided so as to cover an inner wall of the trench pattern; and a gate electrode formed so as to be filled in the trench pattern through the gate insulating film and so as to protrude more widely than the trench pattern on both sides of the trench pattern on the insulating film.

8 Claims, 6 Drawing Sheets

SEMICONDUCTOR DEVICE AND METHOD OF MANUFACTURING THE SAME

CROSS REFERENCES TO RELATED APPLICATIONS

The present invention contains subject matter related to Japanese Patent Application JP 2008-057744 filed in the Japan Patent Office on Mar. 7, 2008, the entire contents of which being incorporated herein by reference.

BACKGROUND OF THE INVENTION

1. Field of the Invention

The present invention relates to a semiconductor device and a method of manufacturing the same, and more particularly to a semiconductor device including a metal gate electrode and a method of manufacturing the same.

2. Description of the Related Art

With the progress of the generation of the transistors, scaling based on miniaturization is continuously carried out. On the International Technology Roadmap for Semiconductors (ITRS), a gate length (Lg) of 20 nm or less is expected in the transistor called the 32 nm half pitch (hp) technology generation. For the transistors of this 32 nm-generation, an Effective Oxide Thickness (EOT) of a gate insulating film needs to be scaled for the purpose of ensuring a driving ability (Ids) in correspondence to the scaling of the gate length. Moreover, a depth (Xj) of a diffusion layer also needs to be scaled for the purpose of suppressing a Short Channel Effect (SCE).

A technique for suppressing gate depletion by introducing a metal gate electrode instead of using a polysilicon gate electrode as well as for introducing a high-permittivity (High-k) insulating film as the gate insulating film instead of using a silicon oxide film is investigated as the technique for scaling the effective oxide thickness of the gate insulating film of those techniques.

Here, a material used for the metal gate electrode, for example, tungsten (W), titanium (Ti), hafnium (Hf), ruthenium (Ru) or iridium (Ir) is a material having a high reactive property. For this reason, when a heat treatment is carried out for this sort of material at a high temperature, this sort of material reacts with a gate insulating film, thereby deteriorating a film quality of the gate insulating film. Therefore, a process is preferably adopted such that after completion of the formation of the metal gate electrode, no heat treatment is carried out for the metal gate electrode at the high temperature. One of methods for realizing this process, a buried gate process (a so-called damascene gate process) shown in FIGS. 2A to 2K is proposed. This technique, for example, is described in a non-patent literary document of Atsushi Yagishita et al.: "High Performance Metal Gate MOSFETs Fabricated by CMP for 0.1 μm Regime," International Electron Devices Meeting 1998 Technical Digest pp. 785 to 788 (1998).

In the buried gate process, firstly, as shown in FIG. 2A, a dummy gate 3 made of polysilicon (poly-Si), and a hard mask layer 4 are formed in a lamination form on a semiconductor substrate 1 through a dummy gate insulating film 2. Next, sidewall insulating layers including a spacer insulating film 5a made from either a silicon oxide film or a silicon nitride film, a first sidewall insulating film 5b, and a second sidewall insulating film 5c are formed on sidewalls of the dummy gate 3 and the hard mask layer 4. In addition, a source and a drain 1sd are formed on a surface side of the semiconductor substrate 1, and a silicide layer 6 is then formed on the surface side of the substrate 1.

Next, as shown in FIG. 2B, a liner insulating film 7 made of a silicon nitride is formed above the semiconductor substrate 1, and an interlayer insulating film 8 made of a silicon oxide ($SiO_2$) is formed so as to cover the liner insulating film 7. After that, as shown in FIG. 2C, the interlayer insulating film 8, the liner insulating film 7, and the hard mask layer 4, and the like are polished in order by utilizing a CMP (Chemical Mechanical Polishing) method, thereby exposing the dummy gate 3. Next, as shown in FIG. 2D, the dummy gate 3 and the dummy gate insulating film 2 are selectively etched away in order, thereby forming a trench pattern a for formation of a gate electrode.

Next, as shown in FIG. 2E, a gate insulating film 9 made of a high-permittivity material (for example, a hafnium oxide ($HfO_2$)) such as a metallic oxide film or a metallic nitride film is deposited so as to cover an inner wall of the trench pattern a. Next, as shown in FIG. 2F, an electrode material film obtained by laminating a first base electrode material film 10a made of a hafnium silicide (HfSix), a second base electrode material film 10b made of a titanium nitride (TiN), and a main electrode material film 10c made of tungsten (W) in order is deposited so as to be filled in the trench pattern a.

After that, as shown in FIG. 2G, the main electrode material film 10c, the second base electrode material film 10b, and the first base electrode material film 10a are polished in order by utilizing the CMP method, thereby forming a gate electrode 10 with the first base electrode material film 10a, the second base electrode material film 10b, and the main electrode material film 10c being left only in the trench pattern a. After that, as shown in FIG. 2H, an upper layer insulating film 11 made of a silicon oxide ($SiO_2$) is formed above the semiconductor substrate 1 so as to cover the gate electrode 10. After that, as shown in FIG. 2I, the upper layer insulating film 11 is selectively etched away into a predetermined pattern, thereby forming a connection hole 11a reaching the gate electrode 10.

Next, as shown in FIG. 2J, after etching using a hydrofluoric acid is carried out as a pretreatment for a next film deposition process, a conductive material film obtained by laminating a base conductive film 12a and a main conductive film 12b in order is deposited so as to be filled in the connection hole 11a. After that, as shown in FIG. 2K, the main conductive film 12b and the base conductive film 12a are polished in order by utilizing the CMP method, thereby forming a contact plug 12 with the base conductive film 12a and the main conductive film 12b being left only in the connection hole 11a. After completion of the above process, a wiring (not shown) is formed on the upper layer insulating film 11 so as to be connected to the contact plug 12.

SUMMARY OF THE INVENTION

However, the manufacturing method to which the buried gate process as described above is applied involves the following problems. That is to say, in the phase of the etching for forming the connection hole 11a in the upper layer insulating film 11 made of the silicon oxide ($SiO_2$) so as to reach the gate electrode 10, the etching for the first base electrode material film 10a made of a hafnium silicide (HfSix) or the like, and the gate insulating film 9 made of a hafnium oxide ($HfO_2$) progresses. In particular, by carrying out the etching using a hydrofluoric acid as the pretreatment for the film deposition of the base conductive film 12a and the main conductive film 12b in the next process, the etching for the first base electrode material film 10a and the gate insulating film 9 further progresses, thereby forming gaps A on both sides of the gate electrode 10, respectively.

As a result, in the process shown in FIG. 2J, when the base conductive film 12a and the main conductive film 12b are laminated and deposited in order so as to be filled in the connection hole 11a, the base conductive film 12a and the main conductive film 12b are hardly filled in the gaps A on the both sides of the gate electrode 10, so that it is easy for voids b to occur in the gaps A. The occurrence of such voids b in the gaps A becomes a cause for increasing a connection resistance between the gate electrode 10 and the contact plug 12.

In addition, since the gate insulating film 9 also retracts by carrying out the etching described above, a portion of the gate insulating film 9 below the gate electrode 10 is thinned, which becomes a cause for deteriorating a withstanding voltage.

Moreover, since the etching for the both sides of the gate electrode 10 progresses every material, the different kinds of conductive materials, i.e., the first base electrode material film 10a and the base conductive film 12a mixedly exist on each of the both sides of the gate electrode 10. As a result, it is difficult to optimize the conditions for formation of the contact plug 12, which becomes a cause for a fluctuation or dispersion of the characteristics of the resulting semiconductor device.

In the light of the foregoing, it is therefore desirable to provide a semiconductor device in which material films on both sides of a buried gate electrode is prevented from retracting, thereby improving characteristics, and a method of manufacturing the same.

In order to attain the desire described above, according to an embodiment of the present invention, there is provided a semiconductor device, including: an insulating film provided on a semiconductor substrate so as to have a trench pattern; a gate insulating film provided so as to cover an inner wall of the trench pattern; and a gate electrode formed so as to be filled in the trench pattern through the gate insulating film and so as to protrude more widely than the trench pattern on both sides of the trench pattern on the insulating film.

According to another embodiment of the present invention, there is provided a method of manufacturing a semiconductor device, including the steps of: forming a dummy gate above a semiconductor substrate, and depositing an insulating film so as to cover the dummy gate; removing the dummy gate after the dummy gate is exposed from the insulating film, thereby forming a trench pattern having a bottom portion to which the semiconductor substrate is exposed in the insulating film; depositing an electrode material film so as to be filled in the trench pattern through the gate insulating film; and patterning the electrode material film into a shape protruding more widely than the trench pattern on both sides of the trench pattern on the insulating film, thereby forming a gate electrode made from the electrode material film.

In the semiconductor device having the structure as described above, an opening portion of the trench pattern is perfectly covered with the gate electrode. Thus, a boundary portion between a sidewall of the trench pattern, and each of the gate insulating film and the gate electrode is protected by the gate electrode. For this reason, even when an upper layer insulating film, for example, is provided so as to cover the gate electrode, and a connection hole is formed in the upper layer insulating film so as to reach the gate electrode, no boundary portion is exposed to a bottom portion of the connection hole. As a result, the boundary portion can be held so as to be protected.

As set forth hereinabove, according to the embodiments of the present invention, the gate electrode can cover and protect the boundary portion between the gate electrode filled in the trench pattern through the gate insulating film, and the sidewall of the trench pattern. Therefore, it is possible to prevent the occurrence of the void due to the retraction of the material layers provided in the boundary portion, or the like. As a result, it is possible to obtain the semiconductor device having the improved characteristics.

DETAILED DESCRIPTION OF THE PREFERRED EMBODIMENT

Figure 1A:
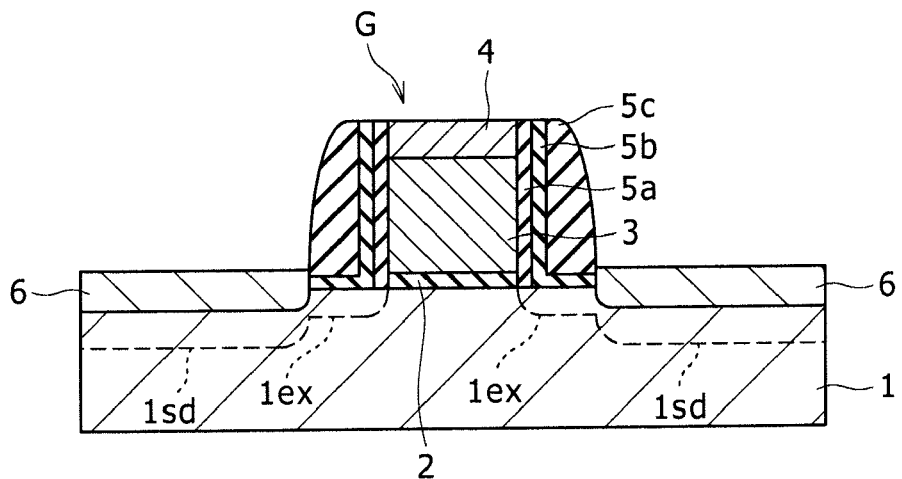
FIGS. 1A to 1K are respectively cross sectional views showing respective processes in a method of manufacturing a semiconductor device according to an embodiment of the present invention.

Hereinafter, an embodiment of the present invention will be described in detail with reference to the accompanying drawings. In this case, an insulated gate field-effect transistor (a so-called MOS (Metal Oxide Semiconductor) transistor) having a metal gate electrode formed in a buried gate process is applied to the embodiment of the present invention. In the embodiment of the present invention, firstly, a method of manufacturing a semiconductor device will be described, and secondly, a structure of the semiconductor device obtained by utilizing the manufacturing method will be described. In addition, the description will be given in a state in which the same constituent elements as those in the related art described with reference to FIGS. 2A to 2K are designated with the same reference numerals or symbols, respectively.

Method of Manufacturing Semiconductor Device

FIGS. 1A to 1K are respectively cross sectional views showing respective processes in the method of manufacturing the semiconductor device according to the embodiment of the present invention. Of these processes, the processes of the first half shown in FIGS. 1A to 1F may be carried out similarly to the case of the processes described with reference to FIGS. 2A to 2F. Next, details of these processes will be described.

That is to say, firstly, as shown in FIG. 1A, a semiconductor substrate 1, for example, made of single-crystal silicon is prepared. Also, although an illustration is omitted in FIG. 1A, an isolation region made of a silicon oxide ($SiO_2$) through which an element region is partitioned into active regions is formed on a surface side of the semiconductor substrate 1. Moreover, a p-type well is formed in the active region in which an n-channel insulated gate field-effect transistor is intended to be formed, and an n-type well is formed in the active region in which a p-channel insulated gate field-effect transistor is intended to be formed. Also, channel diffusion layers (not shown) are formed on the surface sides of the active regions, respectively.

In addition, a gate electrode structure G obtained by laminating a dummy gate 3 made of polysilicon (poly-Si) and a hard mask layer 4 made of a silicon nitride (SiN) in order on an upper portion of the semiconductor substrate 1 having the individual regions formed thereon through a dummy gate insulating film 2 made of a silicon oxide ($SiO_2$). In this case, after the dummy gate 3 and the hard mask layer 4 are laminated and deposited in order on the semiconductor substrate 1 through the dummy gate insulating film 2, the resulting lamination film is etched into a pattern of a gate electrode shape, thereby forming the gate electrode structure G. It is noted that the dummy gate 3, for example, is in the range of about 10 to about 50 nm in height, and is about 30 nm in width.

Next, a spacer insulating film 5a made of a silicon nitride (SiN) is formed on each of both sidewalls of the gate electrode structure G. Also, an impurity is introduced into the semiconductor substrate 1 by using each of the gate electrode structure G and the spacer insulating film 5a as a mask, thereby forming extension regions 1ex of a source and a drain in a surface layer of the semiconductor substrate 1.

After that, a first sidewall insulating film 5b made of a silicon oxide ($SiO_2$), and a second sidewall insulating film 5c made of a silicon nitride (SiN) are further formed in order on each of the both sidewalls of the gate electrode substrate G. In this case, a silicon oxide film (a first sidewall insulating film material) and a silicon nitride film (a second sidewall insulating film material) are laminated and deposited in this order, and anisotropic etching is carried out for the resulting lamination film, thereby leaving the silicon oxide film and the silicon nitride film only on each of the both sidewalls of the gate electrode structure G. In such a manner, the first sidewall insulating film 5b and the second sidewall insulating film 5c are formed.

Next, an impurity is introduced into the semiconductor substrate 1 by using each of the spacer insulating film 5a, the first sidewall insulating film 5b, and the second sidewall insulating film 5c formed on each of the sidewalls of the gate electrode structure G, and the gate electrode structure G as a mask, thereby forming source and drain regions 1sd in the surface layer of the semiconductor substrate 1. After that, exposed surface layers of the source and drain regions 1sd, that is, an exposed surface layer of the semiconductor substrate 1 made of single-crystal silicon is silicidized to form a silicide layer 6.

Figure 1B:
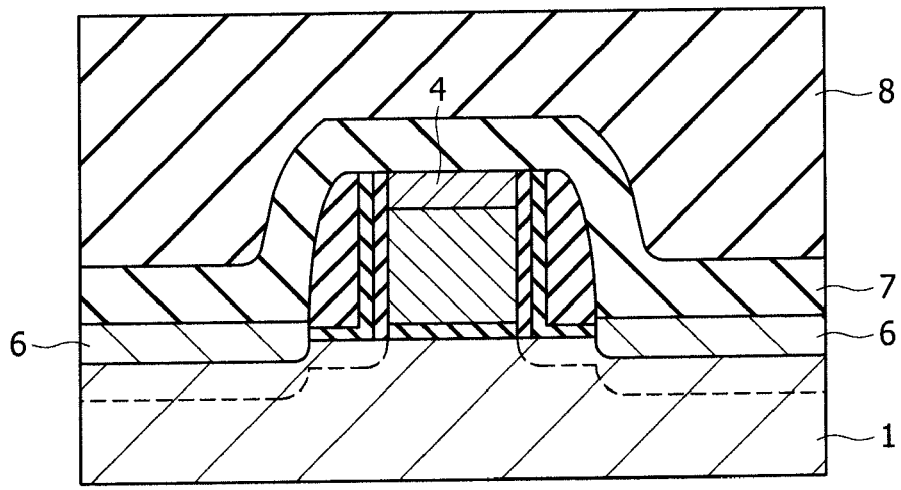

Next, as shown in FIG. 1B, a liner insulating layer 7 made of a silicon nitride (SiN) is formed above the semiconductor substrate 1 so as to cover the gate electrode structure G and the silicide layer 6. Also, an interlayer insulating film 8 made of a silicon oxide ($SiO_2$) is deposited on the liner insulating film 7. In this case, the interlayer insulating film 8 is deposited to have a thickness enough to be filled in irregularities caused by the gate electrode structure G.

Figure 1C:
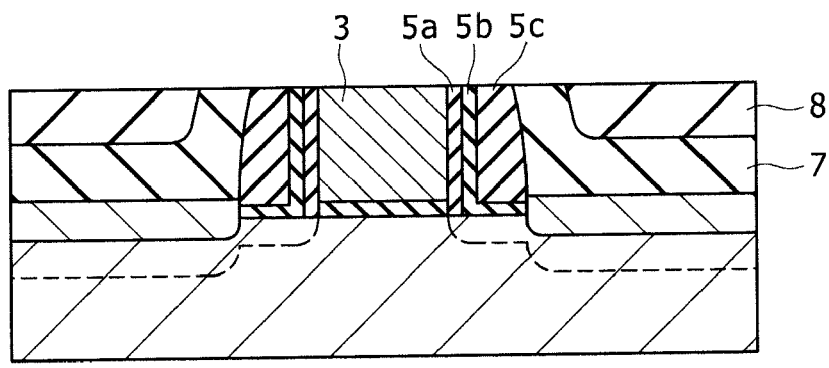

Next, as shown in FIG. 1C, the interlayer insulating film 8, the liner insulating film 7, and the hard mask layer 4 are polished in this order from the above of the interlayer insulating film 8 by utilizing a CMP method, thereby exposing the dummy gate 3. As a result, the dummy gate 3 is exposed from the polished surface, and moreover, the spacer insulating film 5a, the first sidewall insulating film 5b, and the second sidewall insulating film 5c which are formed on each of the sidewalls of the gate electrode structure G, and the liner insulating film 7 and the interlayer insulating film 8 are all exposed.

Figure 1D:
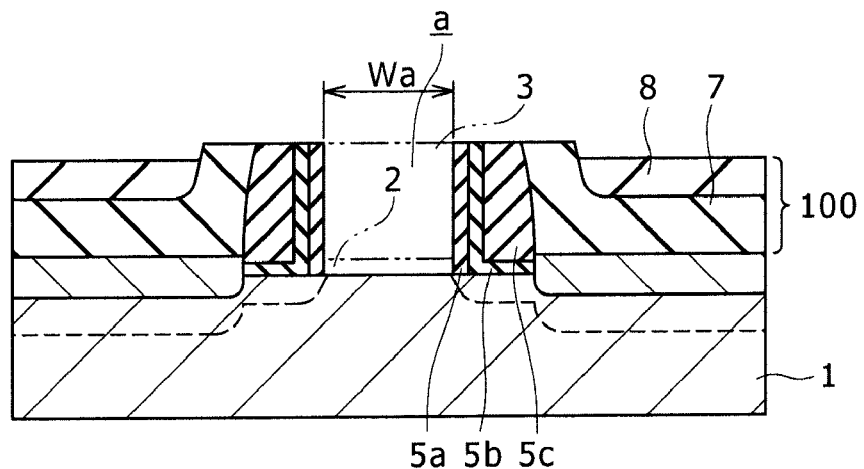

Next, as shown in FIG. 1D, the dummy gate 3 made of polysilicon (poly-Si) and the dummy gate insulating film 2 made of an silicon oxide ($SiO_2$) is successively, selectively etched away, thereby forming a trench pattern a for formation of a buried gate electrode in the removal portion. As a result, there is obtained a structure in which an insulating film 100 having the trench pattern a formed therein is provided on the semiconductor substrate 1. It is noted that the insulating film 100 having the trench pattern a formed therein is composed of the spacer insulating film 5a, the first sidewall insulating film 5b, and the second sidewall insulating film 5c, and the liner insulating film 7 and the interlayer insulating film 8, and also the spacer insulating film 5a, the first sidewall insulating film 5b, and the second sidewall insulating film 5c are provided in the form of a sidewall insulating layer composing each of sidewalls of the trench pattern a. Also, the trench pattern a formed in this process has approximately the same depth and width as the thickness and width of the dummy gate 3. For example, the trench pattern a is in the range of about 10 to about 50 nm in depth, and has an opening width Wa of about 30 nm.

Figure 1E:
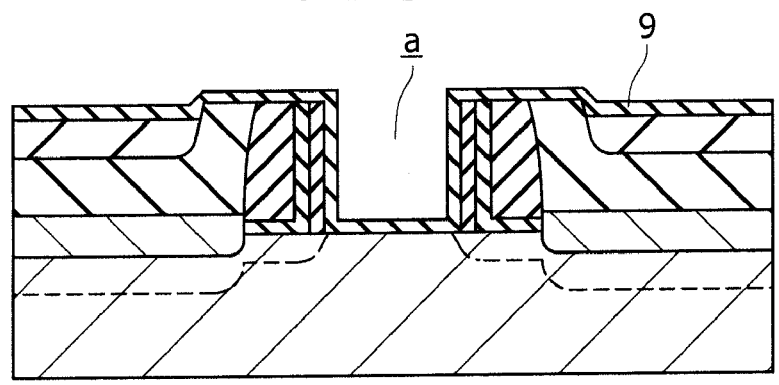

After that, as shown in FIG. 1E, a gate insulating film 9 is deposited so as to cover the inner wall of the trench pattern a. With regard to a material of which the gate insulating film 9 is made, the so-called high-permittivity material having a relative permittivity k ($=\epsilon/\epsilon 0$) of about 4.0 or more can be given in addition to the $SiO_2$ system material, the SiOF system material or the SiN system material which has been generally used in the past. In this case, a film of a metallic oxide such as a zirconium oxide ($ZrO_2$), a hafnium oxide ($HfO_2$), an aluminum oxide ($Al_2O_3$), a yttrium oxide ($Y_2O_3$) or a lanthanum oxide ($La_2O$), or a metallic nitride film can be exemplified as the high-permittivity material. The gate insulating film may be made of one kind of material, or may also be made of plural kinds of materials. In addition, the gate insulating film may be a single film (containing a composite film made of plural kinds of materials in terms of an insulating material), or may also be a lamination film. The gate insulating film of the n-channel insulated gate field-effect transistor, and the gate insulating film of the p-channel insulated gate field-effect transistor can be made of the same material, or can also be made of different materials, respectively.

The gate insulating film 9 as described above can be generally formed by utilizing the well-known method. In particular, an Atomic Layer Deposition (ALD) method, a Metal Organic Chemical Vapor Deposition (MOCVD) method, a sputtering method or the like can be exemplified as the method of forming the gate insulating film made of the high-permittivity material described above. For example, in the case of the gate insulating film 9 made of a hafnium oxide ($HfO_2$), the gate insulating film 9 is deposited by utilizing a CVD method using hafnium chloride ($HfCl_2$) and ammonia ($NH_3$), or a CVD method using an organic hafnium (Hf) gas. In addition, with regard to another film deposition method, a hafnium nitride film is deposited by utilizing the sputtering method using a target made of a hafnium nitride (HfN), and is then oxidized, thereby forming the gate insulating film 9 made of a hafnium oxynitride.

In this case, as an example, the gate insulating film 9 made of a hafnium oxide ($HfO_2$) is deposited to have a thickness of about 3.0 nm.

Figure 1F:
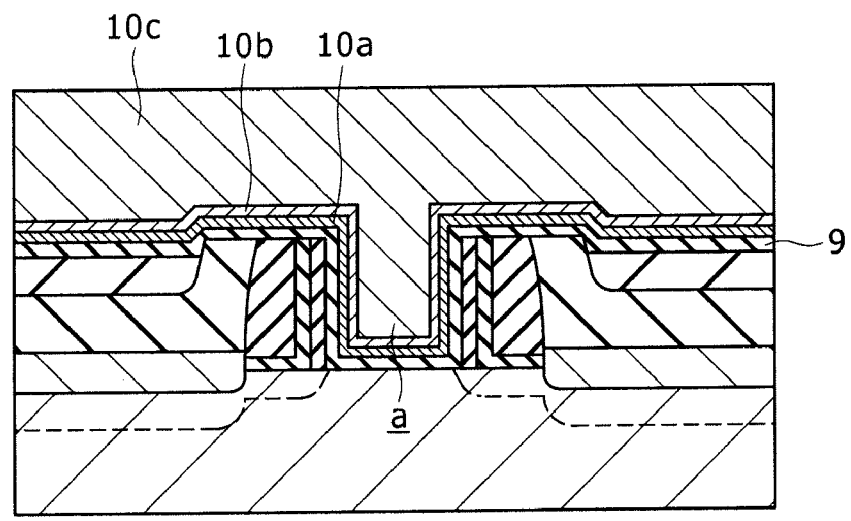

Next, as shown in FIG. 1F, a first base electrode material film 10a, a second base electrode material film 10b, and a main electrode material film 10c are laminated and deposited in this order so as to be filled in the trench pattern a. The first base electrode material film 10a, the second base electrode material film 10b, and that main electrode material film 10c are made of metallic materials, respectively.

In this case, the first base electrode material film 10a, for example, made of a hafnium silicide (HfSix) is deposited as an electrode for the n-channel MOS transistor. That is to say, the first base electrode material film 10a made of a hafnium silicide (HfSix) is deposited to have a thickness of about 15 nm by, for example, utilizing the sputtering method.

Next, the second base electrode material film 10b made of a titanium nitride (TiN) is deposited as a barrier layer on the first base electrode material film 10a. In this case, the second base electrode material film 10b made of a titanium nitride (TiN) is deposited by, for example, utilizing the CVD method, the sputtering method, the ALD method or the like. With the ALD method of these deposition methods, an ammonia ($NH_3$) gas and a tetrachlorotitanium ($TiCl_4$) gas are alternately introduced into a film deposition chamber, whereby the second base electrode material film 10b made of a titanium nitride (TiN) is deposited to have a thickness of about 10 nm.

After that, the main electrode material film 10c made of a metal is deposited on the second base electrode material film 10b. In this case, a metal such as tungsten (W), titanium (Ti), hafnium (Hf), ruthenium (Ru) or iridium (Ir), an alloy thereof, or a metallic compound is used as the material of which the main electrode material film 10c is made. Such a main electrode material film 10c is deposited by, for example, utilizing the CVD method. In this case, the main electrode material film 10c is deposited at a deposition temperature of 350° C. to have a thickness of about 200 nm by utilizing the CVD method using tungsten hexafluoride, hydrogen, and a silane gas.

Up to the above process may be carried out in accordance with the same procedure as that the process, in the related art, shown in FIGS. 2A to 2F. Thus, the feature of the method of manufacturing a semiconductor device according to the embodiment of the present invention includes the processes shown in FIGS. 1G to 1K, respectively.

Figure 1G:
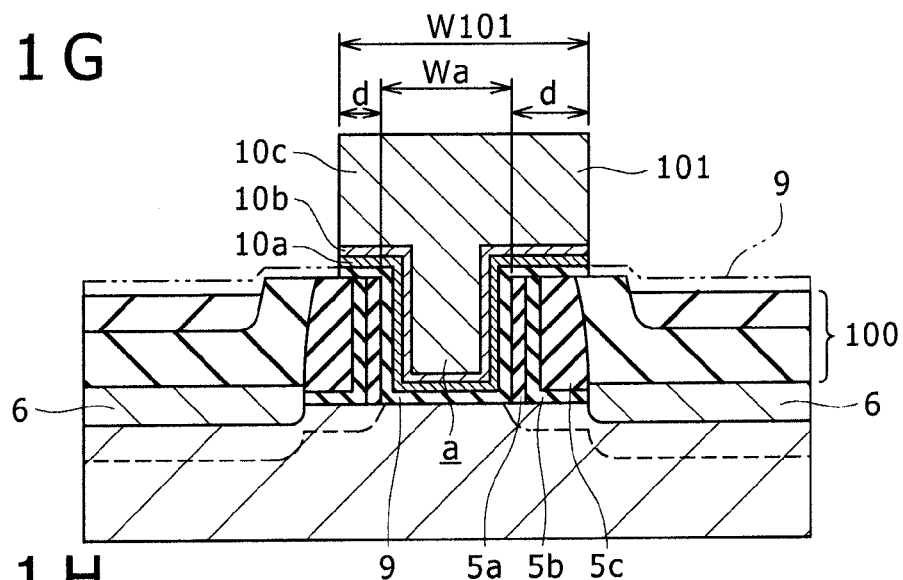

That is to say, firstly, as shown in FIG. 1G, the first base electrode material film 10a, the second base electrode material film 10b, and the main electrode material film 10c are patterned, thereby forming a gate electrode 101. In this case, it is important that the first base electrode material film 10a, the second base electrode material film 10b, and the main electrode material film 10c are patterned into a shape protruding more widely than the trench pattern a on both sides of the trench pattern a. The reason for this is because the first base electrode material film 10a, the second base electrode material film 10b, and the main electrode material film 10c are patterned while a boundary portion between a sidewall of the trench pattern a, and each of the gate insulating film 9 and the gate electrode 101 is protected.

In order to attain this, a line width W101 of the gate electrode 101 on the insulating film 100 is set as being sufficiently larger than an opening width Wa of the trench pattern a. In addition, the line width W101 of the gate electrode 101 preferably has a width enough to cover at least the film made of a silicon oxide ($SiO_2$) of the spacer insulating film 5a, the first sidewall insulating film 5b and the second sidewall insulating film 5c, that is, the first sidewall insulating film 5b. In addition thereto, the line width W101 of the gate electrode 101 is preferably set as being larger than an opening width of a connection hole which will be subsequently formed.

The formation of the gate electrode 101 by the pattern etching for the main electrode material film 10c, the second base electrode material film 10b, and the first base electrode material film 10a as described above is carried out as follows. That is to say, a resist pattern is formed by utilizing a lithography technique, and the main electrode material film 10c, the second base electrode material film 10b, and the first base electrode material film 10a are etched in order with the resist pattern as a mask, thereby forming the gate electrode 101. The etching for the main electrode material film 10c, the second base electrode material film 10b, and the first base electrode material film 10a, for example, is carried out under the following conditions.

[Main Electrode Material Film (W) 10c and Second Base Electrode Material Film (TiN) 10b]
  Gas used: $Cl_2/CF_4$=50 sccm/100 sccm
  Bias power: 150 W
  Pressure: 1.1 Pa
[First Base Electrode Material Film (HfSix) 10a]
  Gas used: $Cl_2/BCl_3$=35 sccm/10 sccm
  Source power: 1,000 W
  Bias power: 150 W
  Pressure: 1.3 Pa (10 millitorrs)
  Substrate temperature: 40° C.

In the phase of formation of the gate electrode 101 as described above, a distance d between an end portion of the trench pattern a, and an end portion of the gate electrode 101 is set as about 150 nm or more in consideration of a patterning precision for a resist which, for example, is formed as the mask during the patterning of the main electrode material film 10c, the second base electrode material film 10b, and the first base electrode material film 10a.

Note that, in the etching for the first base electrode material film 10a made of a hafnium silicide (HfSix) as described above, the etching for the gate insulating film 9 made of a hafnium oxide ($HfO_2$) also progresses. Therefore, the gate insulating film 9 is patterned into the same shape as that of the gate electrode 101. However, the gate insulating film 9 may not be patterned by carrying out the etching.

In addition, the gate electrode 101 may be directly patterned as the wiring on the insulating film 100 as long as the relationship described above can be maintained between the line width W101 of the gate electrode 101 on the insulating film 100, and the opening width Wa of the trench pattern a, and also the insulating property between the gate electrode 101, and each of the silicide layer 6 and the like disposed below the gate electrode 101 can be ensured.

Figure 1H:
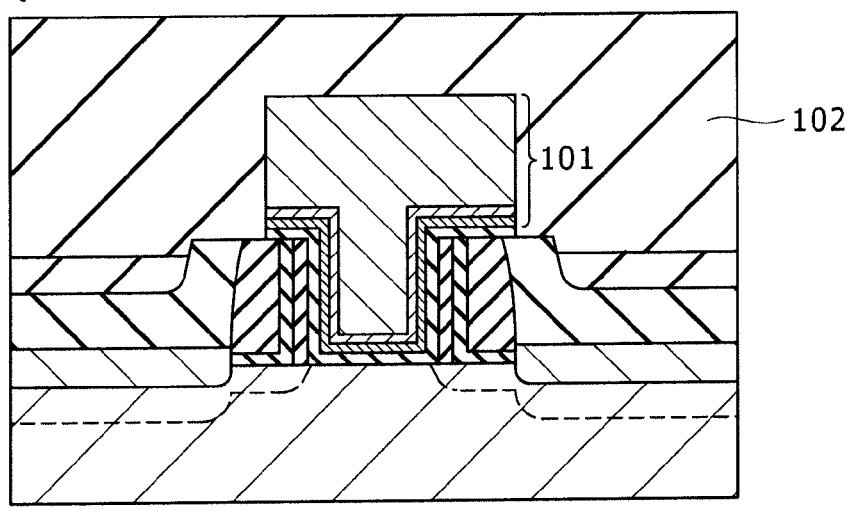

Next, as shown in FIG. 1H, an upper layer insulating film 102 made of a silicon oxide ($SiO_2$) or the like is deposited so as to cover the gate electrode 101. The deposition of the upper layer insulating film 102 is carried out by utilizing a High-Density Plasma (HDS) CVD method, an atmospheric pressure CVD method, a plasma CVD method, or the like.

Figure 1I:
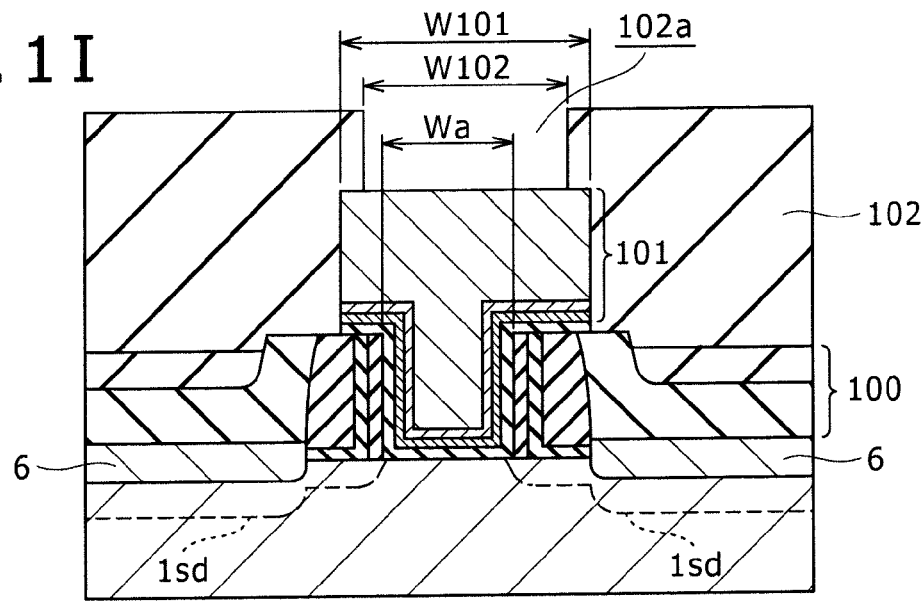

Next, as shown in FIG. 1I, a connection hole 102a is formed in the upper layer insulating film 102 so as to reach the gate electrode 101. In this case, a resist pattern is formed by utilizing the lithography technique, and the upper layer insulating film 102 is selectively etched away with the resist pattern as a mask, thereby forming the connection hole 102a. The etching conditions at this time may be the same as those in the dry etching in the related art.

An opening width W102 of the connection hole 102a thus formed is set in consideration of a conductive property of a contact plug which will be provided within the connection hole 102a in a subsequent process. For example, when the contact plug made of tungsten (W) is formed within the connection hole 102a, the opening width W102 of the connection hole 102a is set at about 60 nm in consideration of the conductive property of the contact plug made of tungsten (W). As has been described, the opening width W102 of the connection hole 102a is generally larger than the opening width Wa (=about 30 nm) of the trench pattern a.

In this embodiment, it is preferable that the opening width W102 of the connection hole 102a as described above is smaller than the line width W101 of the gate electrode 101 on the insulating film 100, and thus a bottom portion of the connection hole 102a is composed of only the gate electrode 101. As a result, the etching during the formation of the connection hole 102a can be perfectly prevented from exerting an influence on the insulating film 100. Therefore, the line width W101 of the gate electrode 101 on the insulating film 100 is preferably formed so as to be larger than 60 nm.

It is noted that in this process, connection holes each reaching the silicide layer 6 overlying the source and the drain 1sd of the semiconductor substrate 1 may be formed at the same time that the connection hole 102a reaching the gate electrode 101 is formed. In addition, the opening width W102 of the connection hole 102a may be larger than the line width W101 of the gate electrode 101 on the insulating film 100 as long as the etching during the formation of the connection hole 102a exerts no influence on the etching for the insulating film 100.

Figure 2A:
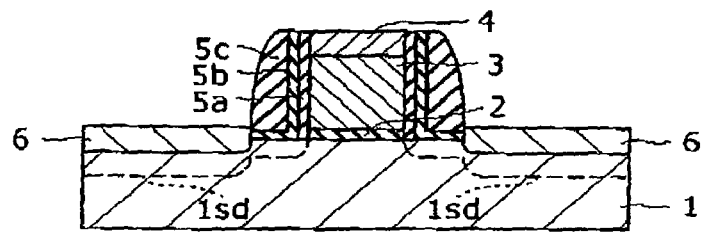
FIGS. 2A to 2K are respectively cross sectional views showing respective processes in a method of manufacturing an existing semiconductor device.
Figure 2B:
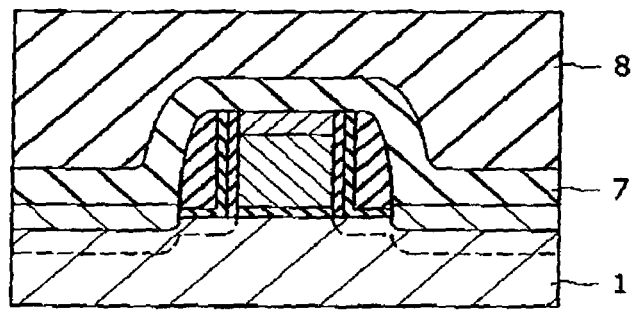
Figure 2C:
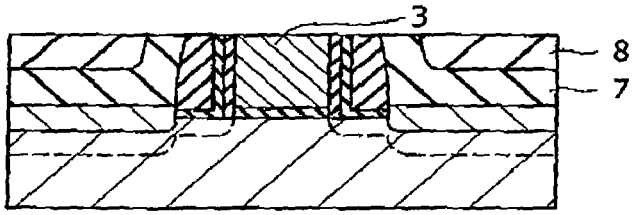
Figure 2D:
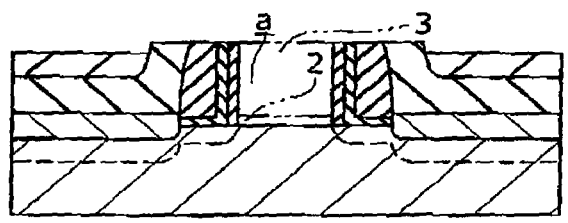
Figure 2E:
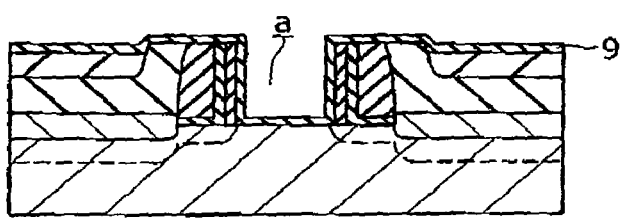
Figure 2F:
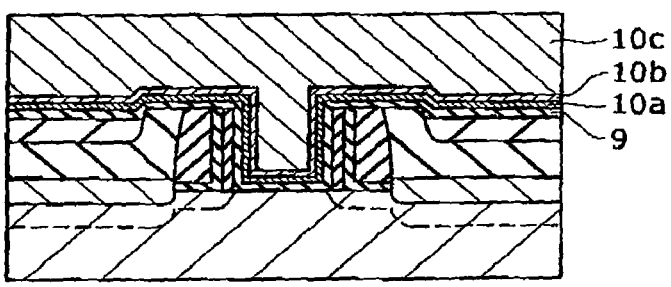
Figure 2G:
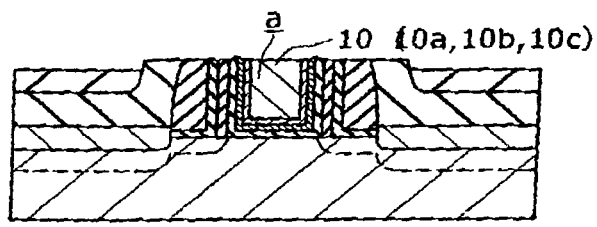
Figure 2H:
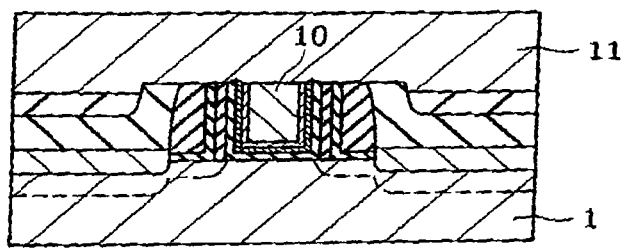
Figure 2I:
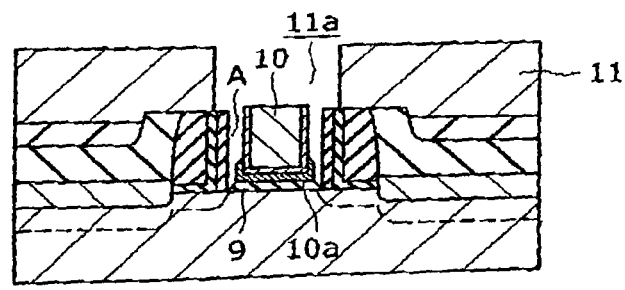
Figure 2J:
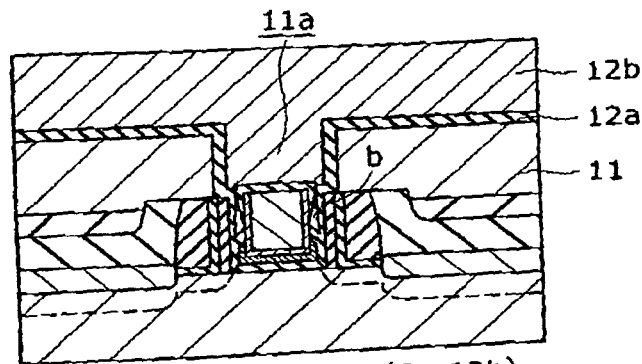
Figure 2K:
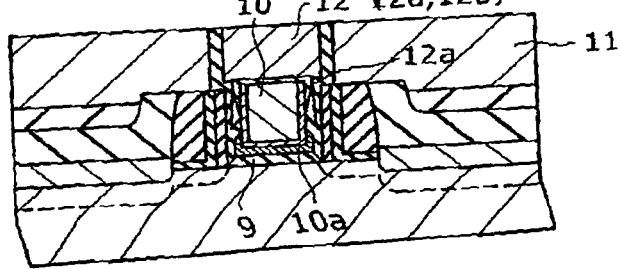

The processes following the above process may be carried out similarly to the procedure described with reference to FIGS. 2J and 2K in the related art. Details thereof will be described below.

Firstly, a process for removing a natural oxide film is carried out as a pretreatment for a contact plug forming process which will be subsequently carried out. In this case, a chemical treatment using a dilute hydrofluoric acid or the like, the sputtering using an argon (Ar) gas, radical etching using fluorine, or the like may be applied to this process.

Figure 1J:
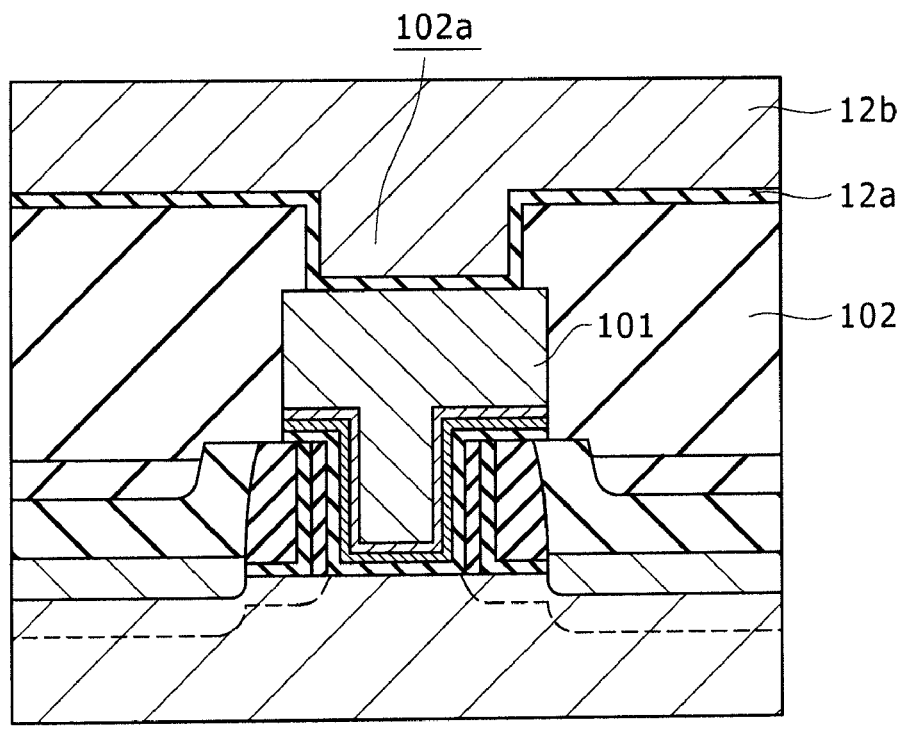

Next, as shown in FIG. 1J, a conductive material film obtained by successively laminating a base conductive film 12a and a main conductive film 12b is deposited so as to be filled in the connection hole 11a.

The base conductive film 12a is provided as a barrier layer, and is formed to have a two-layer lamination structure having a titanium layer as a lower layer and a titanium nitride layer as an upper layer. The titanium layer as the lower layer may have a thickness of several nanometers on the gate electrode 101, and can be formed by utilizing the existing sputtering method. The titanium nitride layer as the upper layer can be formed by utilizing the sputtering method, the CVD method or the ALD method. The conditions for the formation of the titanium layer as the lower layer and the titanium nitride layer as the upper layer may be the conditions which have been used in the past, and the thicknesses of the titanium layer as the lower layer and the titanium nitride layer as the upper layer may also be the thicknesses which have been used in the past.

A tungsten film is deposited by, for example, utilizing the existing CVD method, thereby forming the main conductive film 12b.

Figure 1K:
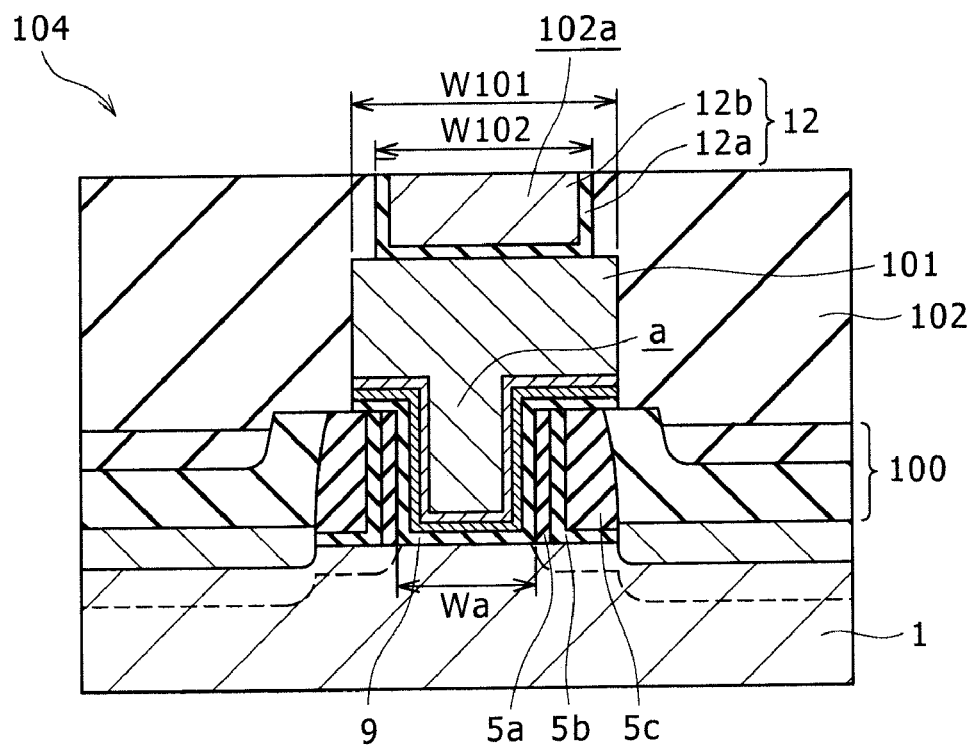

Next, as shown in FIG. 1K, the main conductive film 12b and the base conductive film 12a as the wiring material films are polished in order by utilizing the CMP method to leave the base conductive film 12a and the main conductive film 12b only in the connection hole 102a, thereby forming the contact plug 12.

In addition, in the subsequent process, a wiring (not shown) is formed on the upper layer insulating film 102 so as to be connected to the contact plug 12, thereby completing a semiconductor device 104.

Note that, in the case of the structure in which an aspect ratio of the connection hole 102a formed in the upper layer insulating film 102 is sufficiently small, a process may be adopted such that a material film, having a superior conductive property, such as aluminum is filled in the connection hole 102a, and is then patterned on the upper layer insulating film 102, thereby forming a wiring so as to be connected to the gate electrode 101.

Semiconductor Device

In the semiconductor device 104 manufactured in the manner described above, the insulating film 100 having the shape having the trench pattern a with the opening width Wa is provided on the semiconductor substrate 11 made of single-crystal silicon. The gate insulating film 9 is provided so as to cover the inner wall of the trench pattern a. Also, the gate electrode 101 is provided so as to be filled in the trench pattern a through the gate insulating film 9.

The gate insulating film 9 is preferably made of a high-permittivity material composed of either a metallic oxide film or a metallic nitride film. In this case, an effective thickness of the gate insulating film 9 can be scaled.

In particular, the feature of the gate electrode 101 is that the gate electrode 101 is formed so as to protrude more widely than the trench pattern a on the both sides of the trench pattern a on the insulating film 100. Here, the insulating film 100 having the trench pattern a formed therein includes the spacer insulating film 5a, the first sidewall insulating film 5b made of a silicon oxide (SiO$_2$), and the second sidewall insulating film 5c made of a silicon nitride (SiN) as the sidewall insulating film composing the sidewall of the trench pattern a. In such a structure, the line width W101 of the gate electrode 101 is preferably enough to cover at least the layer made of a silicon oxide (SiO$_2$) of the spacer insulating film 5a, the first sidewall insulating film 5b, and the second sidewall insulating film 5c, that is, the first sidewall insulating film 5b in this case.

It is noted that the gate electrode 101 is preferably the so-called metal gate electrode made of a metallic material, and as a result, the gate depletion can be suppressed. Such a gate electrode 101, for example, has the lamination structure having the first base electrode material film 10a made of hafnium silicide (HfSix), the second base electrode material film 10b made of a titanium nitride (TiN), and the main electrode material film 10c made of tungsten (W), titanium (Ti), hafnium (Hf), ruthenium (Ru), iridium (Ir) or the like as described above.

Also, the upper layer insulating film 102 is provided on the insulating film 100 so as to cover the gate electrode 101, and the connection hole 102a is formed in the upper layer insulating film 102 so as to reach the gate electrode 101. In such a structure, the opening width W102 of the connection hole 102a is preferably larger than the opening width Wa of the trench pattern a, and smaller than the line width W101 of the gate electrode 101 on the insulating film 100.

In the manufacturing method according to the embodiment of the present invention, and the semiconductor device 104 manufactured thereby, the opening portion of the trench pattern a is perfectly covered with the gate electrode 101. As a result, a boundary portion between the sidewall of the trench pattern a, and each of the gate insulating film 9 and the gate electrode 101 is protected by the gate electrode 101. For this reason, even when the connection hole 102a is provided in the upper layer insulating film 102 so as to reach the gate electrode 101 with the gate electrode 101 being partially covered with the upper layer insulating film 102, the boundary portion described above is not exposed to the bottom surface of the connection hole 102a.

As a result, a boundary portion between the gate electrode 101 filled in the trench pattern a through the gate insulating film 9, and the sidewall of the trench pattern a can be covered with the gate electrode 101 to be protected thereby. Therefore, it is possible to prevent occurrence of a void or the like due to the retraction of the material layers provided in this boundary portion. Thus, it is possible to obtain the semiconductor device having the improved characteristics.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
a tri-layered insulating film provided for a trench pattern;
a gate insulating film provided so as to cover a bottom and inner walls of said trench pattern; and
a tri-layered gate electrode formed so as to be filled in said trench pattern through said gate insulating film and so as to protrude more widely than said trench pattern on both sides of said trench pattern on said insulating film;
wherein said gate electrode is formed as to protrude more widely on both sides of the trench pattern and an opening width of a connection hole where a contact plug is formed is wider than the width of said trench pattern but smaller than the width of said gate electrode.

2. The semiconductor device according to claim 1, further comprising
an upper layer insulating film provided on said insulating film so as to cover said gate electrode and so as to have the connection hole reaching said gate electrode.

3. The semiconductor device according to claim 2, wherein an opening width of said connection hole is larger than that of said trench pattern.

4. The semiconductor device according to claim 1, wherein said insulating film includes a sidewall insulating layer composing a sidewall of said trench pattern, and said gate electrode is structured so as to cover said sidewall insulating layer.

5. The semiconductor device according to claim 1, wherein said gate electrode is made of a metallic material.

6. The semiconductor device according to claim 1, wherein said gate insulating film is formed from either a metallic oxide film or a metallic nitride film.

7. The semiconductor device according to claim 1, wherein said tri-layered insulating film comprises:
a spacer insulating film, a first sidewall insulation film and a second sidewall insulation film.

8. The semiconductor device according to claim 1, wherein said tri-layered electrode material comprises:
a first base electrode material, a second base electrode material and a main electrode material.

* * * * *